(12) United States Patent
Nagakubo et al.

(10) Patent No.: US 8,858,712 B2
(45) Date of Patent: Oct. 14, 2014

(54) ELECTRODE FOR USE IN PLASMA PROCESSING APPARATUS AND PLASMA PROCESSING APPARATUS

(75) Inventors: Keiichi Nagakubo, Yamanashi (JP); Takahiro Miyai, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 630 days.

(21) Appl. No.: 12/844,969

(22) Filed: Jul. 28, 2010

(65) Prior Publication Data

US 2011/0024044 A1 Feb. 3, 2011

Related U.S. Application Data

(60) Provisional application No. 61/238,295, filed on Aug. 31, 2009.

(30) Foreign Application Priority Data

Jul. 30, 2009 (JP) ................................. 2009-177792

(51) Int. Cl.
*C23C 16/00* (2006.01)
*C23C 16/455* (2006.01)
*C23F 1/00* (2006.01)
*H01J 37/32* (2006.01)

(52) U.S. Cl.
CPC ..... *C23C 16/45565* (2013.01); *H01J 37/32541* (2013.01); *H01J 37/3244* (2013.01); *H01J 37/3255* (2013.01); *H01J 37/32449* (2013.01)
USPC .................. 118/715; 118/723 E; 156/345.33; 156/345.34; 156/345.43; 156/345.44; 156/345.45; 156/345.46; 156/345.47

(58) Field of Classification Search
CPC .................. C23C 16/45563; C23C 16/45565; C23C 16/45574; C23C 16/45576; H01J 37/32018; H01J 37/32027; H01J 37/32036; H01J 37/32091; H01J 37/3244; H01J 37/32449; H01J 37/32532; H01J 37/32541; H01J 37/3255
USPC ............. 156/345.33, 345.34, 345.43–345.47; 118/723 R, 723 E, 715
See application file for complete search history.

(56) References Cited

U.S. PATENT DOCUMENTS 5,074,456 A * 12/1991 Degner et al. ............. 156/345.34
5,968,275 A * 10/1999 Lee et al. ................... 118/723 R
(Continued)

FOREIGN PATENT DOCUMENTS

JP 09-275093 A 10/1997
JP 2007-005491 A 1/2007
(Continued)

*Primary Examiner* — Rakesh Dhingra
*Assistant Examiner* — Benjamin Kendall
(74) *Attorney, Agent, or Firm* — Pearne & Gordon LLP

(57) ABSTRACT

An electrode for use in a plasma processing apparatus is provided above a lower electrode within a processing chamber so as to face the lower electrode serving as a mounting table configured to mount thereon a processing target substrate. The electrode includes an upper member provided with a plurality of gas passage holes through which a processing gas is supplied; and a lower member positioned below the upper member and provided with multiple sets of gas discharge holes through which the processing gas is discharged. Here, each gas passage hole may have a diameter larger than that of each gas discharge hole, each set of the gas discharge holes may communicate with corresponding one of the gas passage holes, and each set of the gas discharge holes may be arranged outside the rim of the corresponding one of the gas passage holes when viewed from a top thereof.

7 Claims, 5 Drawing Sheets

(56) References Cited

U.S. PATENT DOCUMENTS

| | | | |
|---|---|---|---|
| 6,432,259 B1 * | 8/2002 | Noorbakhsh et al. | 156/345.33 |
| 6,786,175 B2 * | 9/2004 | Dhindsa et al. | 118/723 E |
| 6,872,259 B2 * | 3/2005 | Strang | 118/715 |
| 2003/0234079 A1 * | 12/2003 | Jiang et al. | 156/345.33 |
| 2006/0108069 A1 * | 5/2006 | Gernert | 156/345.34 |
| 2006/0288934 A1 * | 12/2006 | Takahashi et al. | 118/715 |
| 2009/0061083 A1 * | 3/2009 | Chiang et al. | 427/248.1 |
| 2009/0120583 A1 * | 5/2009 | Steger | 156/345.34 |
| 2011/0042008 A1 * | 2/2011 | Hori et al. | 156/345.33 |

FOREIGN PATENT DOCUMENTS

| | | |
|---|---|---|
| JP | 2008-166853 A | 7/2008 |
| WO | WO 2009104709 A1 * | 8/2009 |

\* cited by examiner

ELECTRODE FOR USE IN PLASMA PROCESSING APPARATUS AND PLASMA PROCESSING APPARATUS

CROSS-REFERENCE TO RELATED APPLICATION

This application claims the benefit of Japanese Patent Application No. 2009-177792 filed on Jul. 30, 2009, and U.S. Provisional Application Ser. No. 61/238,295 filed on Aug. 31, 2009, the entire disclosures of which are incorporated herein by reference.

FIELD OF THE INVENTION

The present disclosure relates to an electrode for use in a plasma processing apparatus and a plasma processing apparatus using the same.

BACKGROUND OF THE INVENTION

Conventionally, in the field of manufacture of semiconductor devices, there has been known a plasma processing apparatus that processes a target substrate such as a semiconductor wafer by generating plasma within a hermetically sealed processing chamber. One example of such a plasma processing apparatus is a capacitively coupled plasma processing apparatus configured to generate plasma by applying a high frequency power between a lower electrode serving as a mounting table for mounting a target substrate thereon and an upper electrode provided to face the lower electrode. As one example, the capacitively coupled plasma processing apparatus may have a configuration in which a processing gas is supplied through a multiple number of gas discharge holes provided in the upper electrode, as in a shower device.

In the plasma processing apparatus having the aforementioned configuration, a surface of the upper electrode positioned to face a semiconductor wafer or the like may be formed of, e.g., a silicon electrode plate. In such a case, as a surface of a gas discharge hole provided in the upper electrode is eroded by plasma, a diameter of the gas discharge hole is enlarged. If the upper electrode having the gas discharge hole of the enlarged diameter continues to be used, electrons or ions flown into the gas discharge hole may reach a cooling plate on the side of a rear surface of the electrode, resulting in an abnormal electric discharge. Further, a gas within the gas discharge hole may be ionized by the electrons or ions, also resulting in an abnormal electric discharge. For the reason, the upper electrode is used only during a limited lifetime to prevent the abnormal electric discharge beforehand.

Moreover, it is known to arrange gas discharge holes in a labyrinth structure so as to prevent an abnormal electric discharge caused by the electrons or ions flown into the gas discharge holes. As one example, there has been known a labyrinth structure in which plates having a multiple number of fine holes are layered on top of each other and positions of the fine holes are deviated from each other (see, for example, Patent Document 1). Meanwhile, there has been known a labyrinth structure in which a large-diameter screw hole is provided above a gas discharge hole of a gas discharge plate and then a cylindrical screw having a hole at an eccentric position is screwed into the screw hole. Accordingly, the labyrinth structure can be formed by the gas discharge hole of the gas discharge plate and the eccentric hole of the screw (see, for example, Patent Document 2).

Patent Document 1: Japanese Patent Laid-open Publication No. 2007-5491

Patent Document 2: Japanese Patent Laid-open Publication No. H9-275093

As discussed above, conventionally, since the electrode plate needs to be replaced before the diameter of the gas discharge holes exceeds a certain size in order to suppress an abnormal electric discharge, a maintenance cycle is shortened, which results in a reduction of an operating rate or an increase of a running cost. Further, when a labyrinth structure is used to avoid such problems, a manufacturing cost may increase due to complication of the labyrinth structure. Furthermore, since conductance is decreased, a pressure within the gas discharge holes may increase, which may cause an abnormal electric discharge due to ionization of a processing gas. Especially, the problem of the occurrence of the abnormal electric discharge due to the ionization of the processing gas becomes serious in a recent plasma process in which a higher power tends to be used.

BRIEF SUMMARY OF THE INVENTION

In view of the foregoing, the present disclosure provides an electrode for use in a plasma processing apparatus and a plasma processing apparatus using the same capable of improving productivity due to increased lifetime by reducing a risk of an abnormal electric discharge without causing an increase of a manufacturing cost.

In accordance with one aspect of the present disclosure, there is provided an electrode for use in a plasma processing apparatus. The electrode is provided above a lower electrode within a processing chamber of the plasma processing apparatus so as to face the lower electrode serving as a mounting table configured to mount thereon a processing target substrate. Further, the electrode includes an upper member provided with a plurality of gas passage holes through which a processing gas is supplied; and a lower member positioned below the upper member and provided with multiple sets of gas discharge holes through which the processing gas is discharged. Here, each gas passage hole may have a diameter larger than that of each gas discharge hole, each set of the gas discharge holes may communicate with corresponding one of the gas passage holes, and each set of the gas discharge holes may be arranged outside the rim of the corresponding one of the gas passage holes when viewed from a top thereof.

In accordance with another aspect of the present disclosure, there is provided a plasma processing apparatus including an electrode provided above a lower electrode within a processing chamber of the plasma processing apparatus so as to face the lower electrode which serves as a mounting table configured to mount thereon a processing target substrate. The electrode includes an upper member provided with a plurality of gas passage holes through which a processing gas is supplied; and a lower member positioned below the upper member and provided with multiple sets of gas discharge holes through which the processing gas is discharged. Here, each gas passage hole may have a diameter larger than that of each gas discharge hole, each set of the gas discharge holes may communicate with corresponding one of the gas passage holes, and each set of the gas discharge holes may be arranged outside the rim of the corresponding one of the gas passage holes when viewed from a top thereof.

In accordance with the present disclosure, there can be provided an electrode for use in a plasma processing apparatus and a plasma processing apparatus using the same capable of improving productivity due to increased lifetime by reducing a risk of an abnormal electric discharge without causing an increase of a manufacturing cost.

BRIEF DESCRIPTION OF THE DRAWINGS

The disclosure may best be understood by reference to the following description taken in conjunction with the following figures.

DETAILED DESCRIPTION OF THE INVENTION

Figure 1:
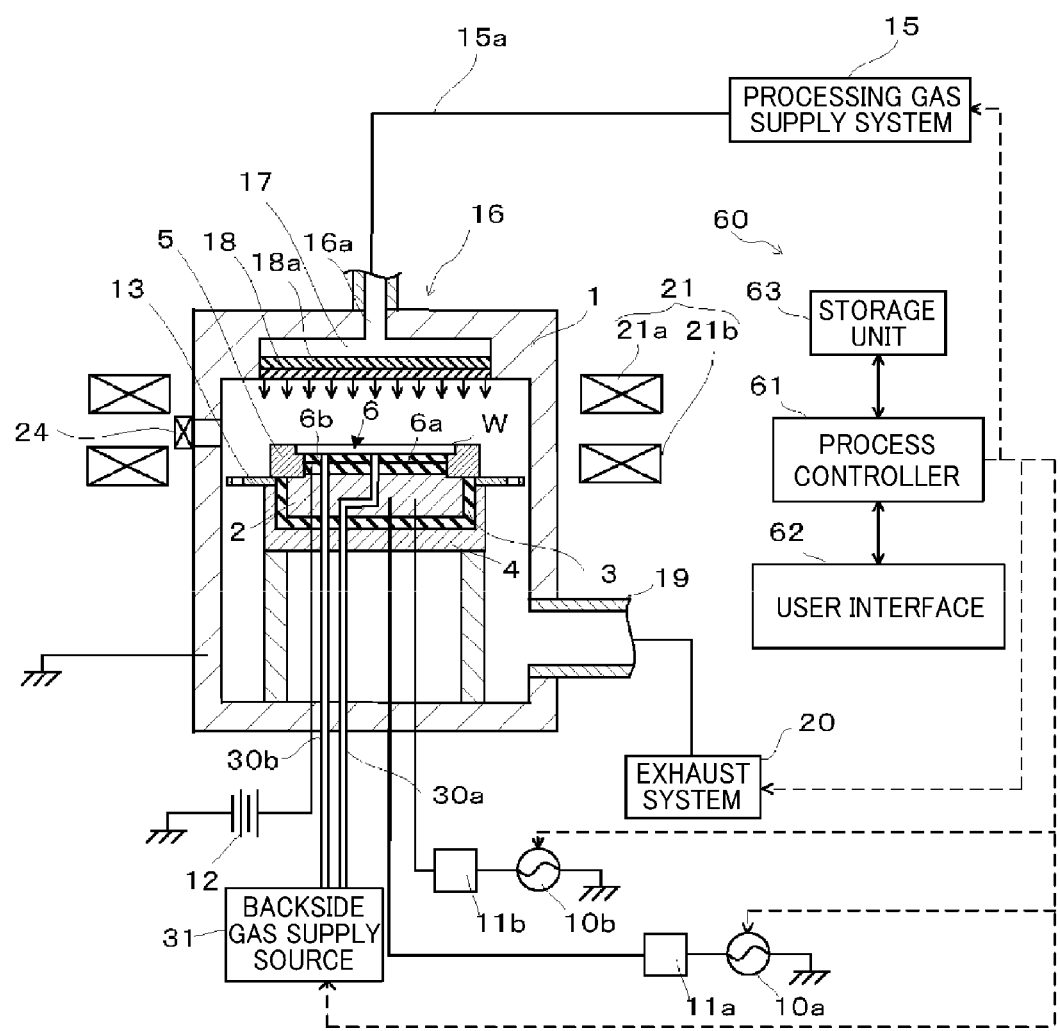
FIG. 1 is a cross sectional view showing a schematic configuration of a plasma processing apparatus in accordance with an embodiment of the present disclosure.

Hereinafter, embodiments of the present disclosure will be described with reference to the accompanying drawings. FIG. 1 illustrates a configuration of a plasma etching apparatus as a plasma processing apparatus in accordance with an embodiment of the present disclosure. The plasma etching apparatus includes a hermetically sealed processing chamber 1 that is electrically grounded.

The processing chamber 1 is formed in a cylindrical shape and is made of, e.g., aluminum having a surface on which an anodic oxide film is formed. A mounting table 2 configured to horizontally mount thereon a semiconductor wafer W as a processing target substrate is installed within the processing chamber 1. The mounting table 2 serves as a lower electrode and is made of a conductive material such as aluminum. Further, the mounting table 2 is supported on a conductive supporting table 4 via an insulating plate 3. An annular focus ring 5 is installed on a periphery of the mounting table 2 so as to surround the semiconductor wafer W.

The mounting table 2 is connected with a first high frequency power supply 10a via a first matching box 11a and is also connected with a second high frequency power supply 10b via a second matching box 11b. A high frequency power of a certain frequency (e.g., about 40 MHz) is supplied from the first high frequency power supply 10a to the mounting table 2. Meanwhile, a high frequency power of a certain frequency (e.g., about 3.2 MHz) lower than that of the first high frequency power supply 10a is supplied from the second high frequency power supply 10b to the mounting table 2.

An electrostatic chuck 6 configured to electrostatically attract and hold the semiconductor wafer W thereon is provided on a top surface of the mounting table 2. The electrostatic chuck 6 includes an insulator 6b and electrode 6a embedded therein. The electrode 6a is connected with a DC power supply 12. A DC voltage is applied from the DC power supply 12 to the electrode 6a, so that the semiconductor wafer W is attracted to and held on the electrostatic chuck 6 by, e.g., a Coulomb force.

A non-illustrated coolant path is formed within the mounting table 2, so that a temperature of the mounting table can be controlled by way of circulating a proper coolant through the coolant path. Further, the mounting table 2 is also provided with backside gas supply channels 30a and 30b through which a backside gas (backside heat transfer gas) such as a helium gas is supplied to a rear surface of the semiconductor wafer W. The backside gas can be supplied from a backside gas supply source 31 to the rear surface of the semiconductor wafer W. Further, the backside gas supply channel 30a is configured to supply the backside gas to a central portion of the semiconductor wafer W, while the backside gas supply channel 30b is configured to supply the backside gas to a peripheral portion of the semiconductor wafer W. With this configuration, the semiconductor wafer W can be controlled to a preset temperature. Further, a gas exhaust ring 13 is installed below a periphery of the focus ring 5. The gas exhaust ring 13 is electrically connected with the processing chamber 1 via the supporting table 4.

Meanwhile, a shower head 16 is installed above the mounting table 2 so as to face the mounting table 2 in parallel. The shower head 16 is electrically grounded. A gas inlet 16a is provided in an upper portion of the shower head 16, and the gas inlet 16a is connected with one end of a gas supply line 15a, and the other end of the gas supply line 15a is connected with a processing gas supply system 15 that supplies a gas (etching gas) for plasma etching or the like.

A space 17 is provided within the shower head 16. An upper electrode (electrode plate) 18 is installed at a lower side of the space 17, and a cooling plate 18a is provided on top of the upper electrode 18. The cooling plate 18a is configured to cool the upper electrode 18 exposed to plasma, and is provided with, e.g., a coolant path formed therein so as to circulate a coolant.

The upper electrode 18 and the cooling plate 18a are provided with gas discharge holes (not shown in FIG. 1) or the like. The gas supplied from the processing gas supply system 15 is introduced into the space 17 within the shower head 16 through the gas supply line 15a and the gas inlet 16a and then is discharged toward the semiconductor wafer W through the gas discharge holes, as indicated by arrows in FIG. 1.

Figure 2:
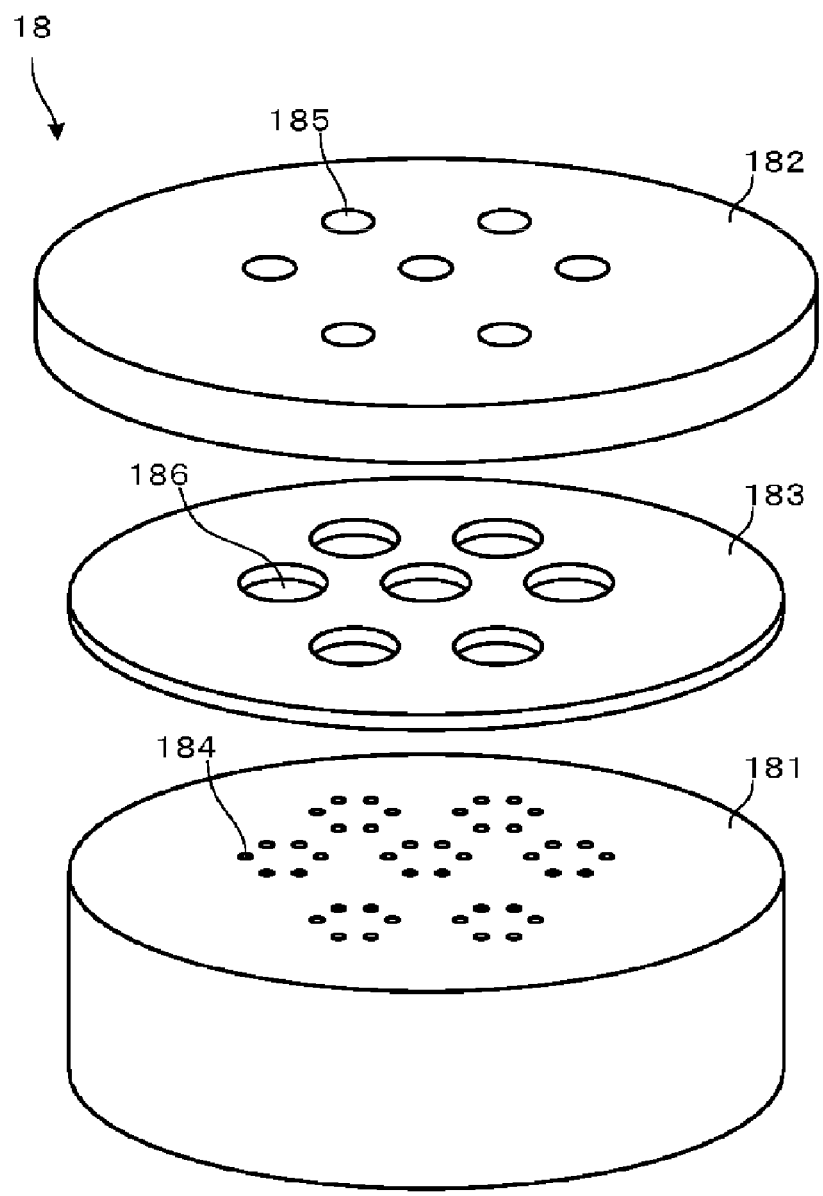
FIG. 2 is an enlarged view illustrating major parts of the plasma processing apparatus of FIG. 1.
Figure 3:
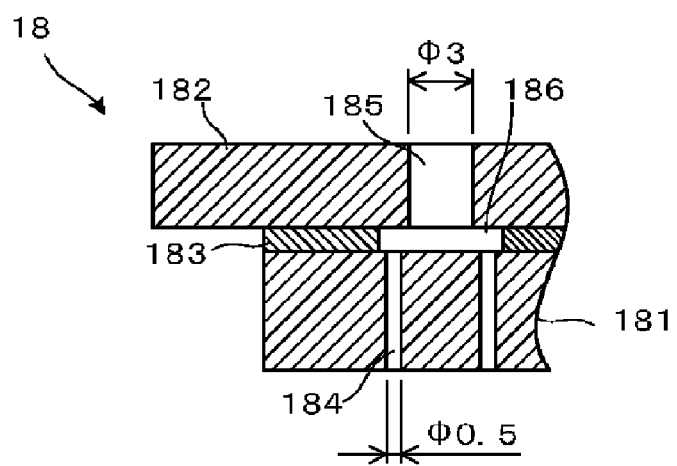
FIG. 3 is an enlarged view illustrating major parts of the plasma processing apparatus of FIG. 1.
Figure 4:
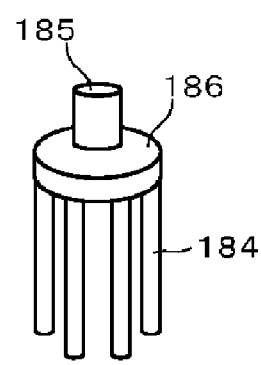
FIG. 4 is an enlarged view illustrating major parts of the plasma processing apparatus of FIG. 1.

FIGS. 2 to 4 illustrate a schematic configuration of the upper electrode 18. As shown in FIGS. 2 and 3, in the present embodiment, the upper electrode 18 includes three plate-shaped members, i.e., a lower member 181, an upper member 182 above the lower member 181, and an intermediate member 183 provided between the lower and upper members 181 and 182. The lower member 181 is made of, e.g., silicon. Further, the lower member 181 is provided with a multiple number of gas discharge holes 184 having a diameter of, e.g., about 0.5 mm. Every six gas discharge holes 184 makes one set, and the six gas discharge holes 184 in each set are arranged on a same circumference at an angular interval of about 60°. Here, FIG. 2 illustrates a schematic configuration of the upper electrode 18, and, thus, the number of the gas discharge holes 184 shown in FIG. 2 is smaller than an actual number thereof. Desirably, the lower member 181 may have a thickness of more than several millimeters and less than about 20 millimeters, and, in the present embodiment, the lower member 181 has a thickness of, e.g., about 7.0 mm.

The upper member 182 is made of, e.g., silicon. The upper member 182 is provided with gas passage holes 185, each of which corresponds to one set of six gas discharge holes 184. Each gas passage hole 185 has a diameter of, e.g., about 3 mm, larger than that of the gas discharge hole 184. Further, as shown in FIG. 3, the gas discharge holes 184 are arranged to be positioned outside the rim of the gas passage hole 185. Desirably, the upper member 182 may have a thickness of several millimeters, and, in the present embodiment, the upper member 182 has a thickness of, e.g., about 3.0 mm.

If just a resin-based adhesive is used for the intermediate member 183, it may cause a thermal resistance to the lower member 181 and the upper member 182, resulting in a process shift. To avoid this problem, a resin sheet such as an acrylic-based resin or a siloxane-based resin mixed with, e.g., an alumina filler having a higher thermal conductivity than that of the resin may be employed for the intermediate member 183 so as to serve as a heat transfer medium. The intermediate member 183 functions as an adhesive layer that allows heat transfer and adhesion between the lower member 181 and the upper member 182. By way of example, an adhesive layer may be provided on each of a top surface and a bottom surface of the intermediate member 183. The intermediate member 183 is provided with a plurality of communication holes 186 configured to allow each set of six gas discharge holes 184 to communicate with their corresponding gas passage hole 185. Each communication hole 186 has a diameter larger than that of the gas passage hole 185, and the communication hole 186 has a diameter of, e.g., about 11.50 mm in the present embodiment. Further, desirably, the intermediate member 183 may have a thickness equal to or larger than about 0.5 mm for securing conductance, and, in the present embodiment, the intermediate member 183 has a thickness of, e.g., about 0.525 mm.

In the present embodiment as described above, the upper electrode (electrode plate) 18 includes the lower member 181, the upper member 182 and the intermediate member 183. A plurality of (six, in the present embodiment) gas discharge holes 184 is configured to communicate with one gas passage hole 185. When viewed from the top (i.e., when a positional relationship between the gas discharge holes 184 and the gas passage hole 185 is viewed from a top or a bottom thereof in a perspective manner), the gas discharge holes 184 are positioned outside the rim of the gas passage hole 185.

Accordingly, there is formed a labyrinth structure in which the gas passage holes 185 are hidden from view when the inside of the gas discharge holes 184 is viewed from a bottom of the lower member 181. Such a structure is capable of preventing electrons or ions in the plasma from reaching the cooling plate 18a on the side of the rear surface of the upper electrode (electrode plate) 18 (see FIG. 1), thereby suppressing the occurrence of an abnormal electric discharge. Thus, even when the upper electrode 18 is exposed to the plasma for a long time and the diameter of the gas discharge holes 184 is gradually enlarged due to this plasma exposure, there is a low possibility that the electrons or ions are introduced into the gas passage holes 185 from the gas discharge holes 184, and, thus, a possibility for causing an abnormal electric discharge can be maintained low. Further, FIG. 4 shows a schematic configuration of a gas flow path formed by the gas passage hole 185, the communication hole 186 and the gas discharge holes 184.

Moreover, in the present embodiment, the upper electrode 18 has a configuration in which the lower member 181, the upper member 182 and the intermediate member 183 are layered on top of each other, and it is only required to align the large-diameter gas passage holes 185 of the upper member 182, the larger-diameter communication holes 186 of the intermediate member 183 and the gas discharge holes 184. Thus, a high level of positioning control is not required in forming the holes. Further, since the number of the holes formed in the upper member 182 or the like can be reduced smaller than the number of the necessary gas discharge holes 184, processes necessary for forming the holes can be reduced as well. Therefore, an increase of a manufacturing cost can be suppressed.

Further, by forming the gas discharge holes 184 of a small diameter to have a short length, conductance can be improved and, thus, a pressure rise of a processing gas within the holes can be suppressed. Accordingly, even when a high frequency power is set high, an abnormal electric discharge resulted from ionization of the processing gas can be suppressed.

Figure 5:
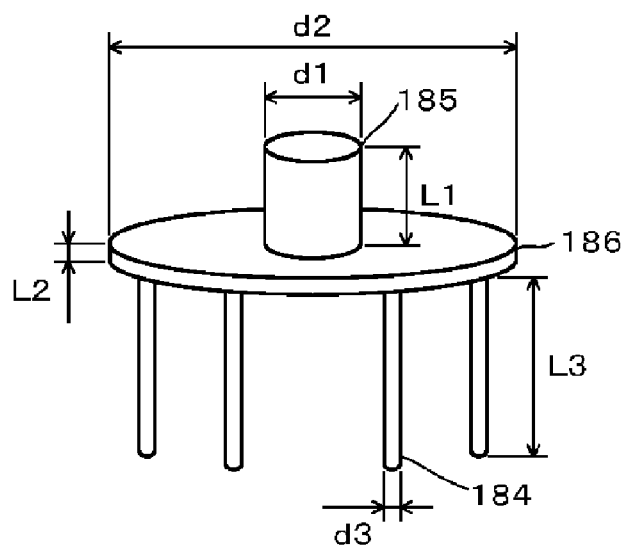
FIG. 5 is a schematic enlarged view illustrating major parts of the plasma processing apparatus of FIG. 1.
Figure 7:
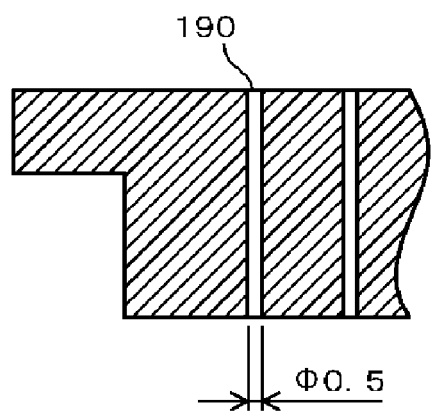
FIG. 7 is an enlarged view illustrating major parts of a conventional plasma processing apparatus.

As shown in FIG. 5, in the gas flow path formed by the gas passage hole 185, the communication hole 186 and the gas discharge holes 184, a diameter d1 and a length L1 of the gas passage hole 185 are both set to be about 3.0 mm; a diameter d2 and a length L2 of the communication hole 186 are set to be about 11.50 mm and 0.525 mm, respectively; a diameter d3 and a length L3 of each gas discharge hole 184 are set to be about 0.5 mm and about 7.0 mm, respectively; and a total number of the gas discharge holes 184 provided on an entire electrode surface is 1266. In such a case, conductance of a gas flow path including the cooling plate is calculated to be about 2427 (relative value). Meanwhile, as shown in FIG. 7, in case that a conventional electrode is provided with straight-line-shaped gas discharge holes 190 having a diameter of about 0.5 mm and a length of about 10.0 mm and a total number of the gas discharge holes 190 on an entire electrode surface is 1283, conductance of a gas flow path including a cooling plate is calculated to be about 1369 (relative value). Accordingly, in the present embodiment, the conductance can be about 1.77 (2427/1369) times as great as that of the conventional electrode.

Referring back to FIG. 1, an exhaust port 19 is provided at a lower portion of the processing chamber 1, and an exhaust system 20 is coupled to the exhaust port 19. By operating a vacuum pump installed in the exhaust system 20, the inside of the processing chamber 1 can be depressurized to a preset vacuum level. Further, a gate valve 24 serving to open and close a loading/unloading port for the semiconductor wafer W is provided at a sidewall of the processing chamber 1.

A ring magnet 21 is concentrically provided around the processing chamber 1. The ring magnet 21 includes an upper ring magnet 21a and a lower ring magnet 21b positioned below the upper ring magnet 21a. The ring magnet 21 generates a magnetic field in a space between the mounting table 2 and the shower head 16. The ring magnet 21 can be rotated by a rotating unit such as a non-illustrated motor or the like.

The overall operation of the plasma etching apparatus configured as described above is controlled by a control unit 60. The control unit 60 includes a process controller 61 having a CPU for controlling each component of the plasma etching apparatus; a user interface 62; and a storage unit 63.

The user interface 62 includes a keyboard with which a process manager inputs commands to manage the plasma etching apparatus; and a display on which an operational status of the plasma etching apparatus is visualized and displayed.

The storage unit 63 stores therein control programs (software) for executing various processes in the plasma etching apparatus under the control of the process controller 61; and recipes including processing condition data or the like. A necessary recipe may be retrieved from the storage unit 63 and executed by the process controller 61 in response to an instruction from the user interface 62, and, thus, a desired process may be performed in the plasma etching apparatus under the control of the process controller 61. Furthermore, the control programs or the recipes including the processing condition data or the like can be retrieved from a computer-readable storage medium (e.g., a hard disk, a CD, a flexible disk or a semiconductor memory), or can be used on-line by being transmitted from another apparatus via, e.g., a dedicated line, whenever necessary.

Now, a sequence for etching a semiconductor wafer W in the plasma etching apparatus configured as described above will be explained. First, a gate valve 24 is opened, and a semiconductor wafer W is loaded into the processing chamber 1 via a load lock chamber (not shown) by a transfer robot (not shown) or the like and then is mounted on the mounting table 2. Thereafter, the transfer robot is retreated out of the processing chamber 1, and the gate valve 24 is closed. Then, the inside of the processing chamber 1 is evacuated through the exhaust port 19 by the vacuum pump of the exhaust system 20.

After the inside of the processing chamber 1 is evacuated to a preset vacuum level, an etching gas is introduced into the processing chamber 1 from the processing gas supply system 15, and the internal pressure of the processing chamber 1 is maintained at, e.g., about 5.32 Pa. In this state, high frequency powers are applied to the mounting table 2 from the first high frequency power supply 10a and the second high frequency power supply 10b. At this time, a preset DC voltage is applied to the electrode 6a of the electrostatic chuck 6 from the DC power supply 12, so that the semiconductor wafer W is attracted to and held on the electrostatic chuck 6 by, e.g., a Coulomb force.

In such a case, by applying the high frequency powers to the mounting table 2 serving as the lower electrode as described above, an electric field is formed between the upper electrode 18 and the mounting table 2 serving as the lower electrode. Meanwhile, since the horizontal magnetic field is formed between the upper electrode 18 and the mounting table 2 serving as the lower electrode by the ring magnet 21, a magnetron discharge is generated due to drift of electrons in a processing space where the semiconductor wafer W exists. As a result of the magnetron discharge, the processing gas is excited into plasma, and a thin film formed on the semiconductor wafer W is etched by the plasma.

Upon the completion of a preset etching process, the supply of the high frequency powers and the processing gas are stopped, and the semiconductor wafer W is unloaded from the processing chamber 1 in the reverse sequence to that described above.

In the above-described etching process on the semiconductor wafer W, generation of an abnormal electric discharge due to entrance of electrons or ions into the rear surface of the upper electrode 18 or due to ionization of the processing gas can be suppressed in the present embodiment, as discussed above. This effect can be maintained even if the diameter of the gas discharge holes 184 of the upper electrode 18 is enlarged to some extent, so that lifetime of the upper electrode 18 can be increased and productivity can be improved. Furthermore, when the diameter of the gas discharge holes 184 is enlarged to some extent, the lower member 181 may be used upside down. Moreover, in the present embodiment, a manufacturing cost is not increased.

Figure 6:
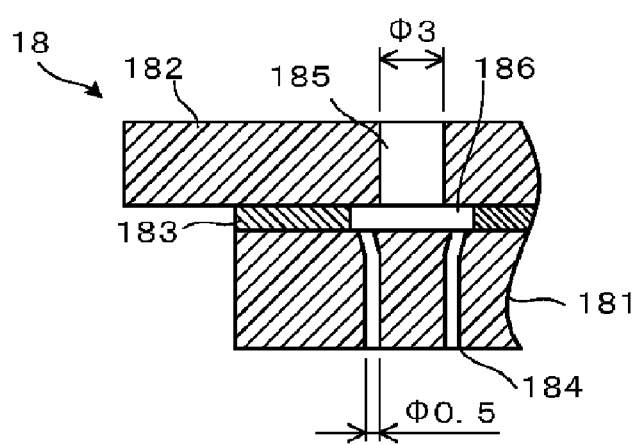
FIG. 6 is an enlarged view illustrating major parts of a plasma processing apparatus in accordance with a modification example.

FIG. 6 illustrates a configuration of a modification example of the above-described embodiment. In this modification example, a gas discharge hole 184 is formed in a lower member 181 such that a part of an upper portion of the gas discharge hole 184 is inclined. In this way, by inclining a part of or an entire gas discharge hole 184 with respect to upper and lower surfaces of the lower member 181, not perpendicular thereto, the possibility that the electrons or ions are introduced into the rear surface of the upper electrode 18 from the gas discharge hole 184 can be further reduced.

The present disclosure is not limited to the above-stated embodiment but can be modified in various ways. For example, in the above-described embodiment, although the upper electrode 18 includes three members, i.e., the lower member 181, the upper member 182 and the intermediate member 183, the upper electrode 18 may include only the lower member 181 and the upper member 182 without the intermediate member 183. In such a case, the communication holes 186 may be provided on a top surface of the lower member 181 or a bottom surface of the upper member 182. Furthermore, the plasma etching apparatus is not limited to the parallel plate plasma etching apparatus of a lower electrode dual frequency application type as illustrated in FIG. 1 but can be applicable to various kinds of plasma etching apparatuses such as a plasma etching apparatus of an upper and lower electrode dual frequency application type or a plasma etching apparatus of a single frequency application type, or also applicable to various kinds of other plasma processing apparatuses.

What is claimed is:

1. An electrode for use in a plasma processing apparatus, the electrode being provided above a lower electrode within a processing chamber of the plasma processing apparatus so as to face the lower electrode serving as a mounting table configured to mount thereon a processing target substrate, the electrode comprising:

an upper member provided with a plurality of gas passage holes through which a processing gas is supplied;

a lower member positioned below the upper member and provided with multiple sets of gas discharge holes through which the processing gas is discharged; and an intermediate plate-shaped member positioned between the upper member and the lower member and provided with a plurality of circular communication holes through the plate-shaped member through which the gas passage holes and the gas discharge holes are allowed to communicate with each other, wherein each communication hole through the plate-shaped member is coaxially aligned with a respective one of the plurality of gas passage holes, and wherein each gas passage hole has a diameter larger than that of each gas discharge hole, each communication hole has a diameter larger than that of each gas passage hole, each set of the gas discharge holes communicates with corresponding one of the gas passage holes via corresponding one of the communication holes, and each set of the gas discharge holes is arranged only outside of a perimeter of the corresponding one of the gas passage holes and inside of a perimeter of the corresponding one of the communication holes when viewed from a top thereof, wherein each gas discharge hole has a constant diameter along an entire thickness of the lower member, an upper part of the each gas discharge hole adjacent the intermediate plate-shaped member is inclined with respect to upper and lower surfaces of the lower member, and a lower part of the each gas discharge hole is substantially perpendicular to upper and lower surfaces of the lower member, so that electrons or ions are suppressed from being introduced into the electrode, and in each set of the gas discharge holes, the upper part of each gas discharge hole is inclined radially outward from a common axis of the corresponding one of the gas passage holes and the corresponding one of the communication holes that are in communication with the gas discharge holes of the set, and the set of gas discharge holes is arrayed annularly around said common axis.

2. The electrode of claim 1, wherein the intermediate plate-shaped member is made of a resin mixed with a material having a higher thermal conductivity than that of the resin.

3. The electrode of claim 2, wherein an adhesive layer is provided on each of a top surface and a bottom surface of the intermediate plate-shaped member so as to be adhered to the upper member and the lower member while allowing a heat transfer therebetween.

4. The electrode of claim 2, wherein the upper member and the lower member are made of a material different from a material of the intermediate plate-shaped member.

5. The electrode of claim 1, wherein the communication holes are dimensioned such that the plurality of circular communication holes extend over a single processing target substrate when viewed from a top thereof.

6. The electrode of claim 1, wherein the perimeter of each of the gas passage holes is circular.

7. A plasma processing apparatus comprising:
an electrode provided above a lower electrode within a processing chamber of the plasma processing apparatus so as to face the lower electrode which serves as a mounting table configured to mount thereon a processing target substrate,
wherein the electrode includes:
an upper member provided with a plurality of gas passage holes through which a processing gas is supplied;
a lower member positioned below the upper member and provided with multiple sets of gas discharge holes through which the processing gas is discharged; and
an intermediate plate-shaped member positioned between the upper member and the lower member and provided with a plurality of circular communication holes through the plate-shaped member through which the gas passage holes and the gas discharge holes are allowed to communicate with each other, wherein each communication hole through the plate-shaped member is coaxially aligned with a respective one of the plurality of gas passage holes, and
further wherein each gas passage hole has a diameter larger than that of each gas discharge hole,
each communication hole has a diameter larger than that of each gas passage hole,
each set of the gas discharge holes communicates with corresponding one of the gas passage holes via corresponding one of the communication holes, and
each set of the gas discharge holes is arranged only outside of a perimeter of the corresponding one of the gas passage holes and inside of a perimeter of the corresponding one of the communication holes when viewed from a top thereof,
wherein each gas discharge hole has a constant diameter along an entire thickness of the lower member,
an upper part of the each gas discharge hole adjacent the intermediate plate-shaped member is inclined with respect to upper and lower surfaces of the lower member, and a lower part of the each gas discharge hole is substantially perpendicular to upper and lower surfaces of the lower member, so that electrons or ions are suppressed from being introduced into the electrode, and
in each set of the gas discharge holes, the upper part of each gas discharge hole is inclined radially outward from a common axis of the corresponding one of the gas passage holes and the corresponding one of the communication holes that are in communication with the gas discharge holes of the set, and the set of gas discharge holes is arrayed annularly around said common axis.

\* \* \* \* \*